US011374732B2

(12) United States Patent
Sorna et al.

(10) Patent No.: US 11,374,732 B2
(45) Date of Patent: Jun. 28, 2022

(54) APPARATUS AND RELATED METHOD TO SYNCHRONIZE OPERATION OF SERIAL REPEATER

(71) Applicant: Marvell Asia Pte, Ltd., Singapore (SG)

(72) Inventors: Michael A. Sorna, Hopewell Junction, NY (US); William R. Kelly, Verbank, NY (US); Louis T. Fasano, Poughkeepsie, NY (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

(21) Appl. No.: 16/726,331

(22) Filed: Dec. 24, 2019

(65) Prior Publication Data

US 2022/0006462 A1 Jan. 6, 2022

(51) Int. Cl.
| | |
|---|---|
| *H03M 9/00* | (2006.01) |
| *H04L 7/033* | (2006.01) |
| *H03L 7/091* | (2006.01) |
| *H03L 7/099* | (2006.01) |
| *H04B 10/29* | (2013.01) |
| *H04L 25/24* | (2006.01) |
| *H04L 25/22* | (2006.01) |

(52) U.S. Cl.
CPC ............ *H04L 7/0331* (2013.01); *H03L 7/091* (2013.01); *H03L 7/0991* (2013.01); *H03M 9/00* (2013.01); *H04B 10/29* (2013.01); *H04L 25/22* (2013.01); *H04L 25/242* (2013.01)

(58) Field of Classification Search
USPC ........................................................ 341/100
See application file for complete search history.

(56) References Cited

U.S. PATENT DOCUMENTS

| | | | |
|---|---|---|---|
| 9,036,729 B2 | 5/2015 | Pham et al. | |
| 9,344,271 B1 | 5/2016 | Dusatko | |
| 9,705,668 B2 | 7/2017 | Huang | |
| 2002/0075981 A1* | 6/2002 | Tang | H04J 3/047 375/372 |
| 2006/0133466 A1* | 6/2006 | Palmer | H04L 7/005 375/215 |
| 2006/0133816 A1* | 6/2006 | Shin | H04L 7/0075 398/154 |
| 2011/0169535 A1* | 7/2011 | Kyles | H03L 7/0812 327/156 |
| 2018/0219539 A1* | 8/2018 | Arp | H03K 5/04 |

OTHER PUBLICATIONS

Park, Jihwan et al., Comparison of phase rotator performance and proposal of design method, Semantic Scholar URL https://www.semanticscholar.org/paper/Comparison-of-phase-rotator-performance-and-of-Park-Hong/e0e225a624b0eb92540b566530049c5cc3dcc6a3?p2df (Year: 2012).*

* cited by examiner

*Primary Examiner* — Jean B Jeanglaude (57) ABSTRACT

Embodiments of the present disclosure provide an apparatus including: a phase detector for detecting a write frequency of a deserializer and a read frequency of a serializer, such that the phase detector outputs a first code sequence in response to the write frequency being greater than the read frequency, or a second code sequence at the rotator input in response to the write frequency being less than the read frequency; and a phase rotator for receiving the first code sequence or the second code sequence from the phase rotator to transmit a pacing signal having the read frequency to the deserializer, wherein the pacing signal causes the read frequency to increase or decrease based on whether the read frequency is different from the write frequency.

20 Claims, 5 Drawing Sheets

APPARATUS AND RELATED METHOD TO SYNCHRONIZE OPERATION OF SERIAL REPEATER

TECHNICAL FIELD

Embodiments of the disclosure relate generally to an apparatus and related methods to synchronize the write and read frequencies of a serial repeater.

BACKGROUND

The rise of networking devices, such as the "Internet of Things" (IoT), with links to a data center has accompanied a larger number of signal-processing elements in semiconductor wafers. Some wafers may include photonic devices, e.g., photonic waveguides, photonic transmitters and receivers, etc., configured to relay signals through light transmission. Semiconductor chips may be modified, adapted, etc., to house the various components needed to transmit light from one component to another. Semiconductor chips which include photonic devices and microcircuitry are known as "photonic integrated circuits" (PICs). A technical challenge associated with PICs involves converting digital signals into optical signals, and thereafter converting the optical signals back to digital signals while retaining the same information without contamination by interference, noise, etc. Similar challenges may occur in other components for converting one type of signal from one device into a digital signal on another device. In cases when optical signals travel from one device to another, further problems may arise where the digital clock of each device operates at a unique frequency, e.g., due to manufacturing variations.

SUMMARY

A first aspect of the present disclosure provides an apparatus including: a phase detector having a first detector input line coupled to a deserializer of a serial repeater to detect a write frequency of the deserializer and a second detector input line coupled to a serializer of the serial repeater to detect a read frequency of the serializer, wherein the phase detector outputs a first code sequence at a rotator input in response to the write frequency being greater than the read frequency, or a second code sequence at the rotator input in response to the write frequency being less than the read frequency; and a phase rotator having a first rotator input line coupled to a phase locked loop (PLL) to receive a clock signal therefrom, a second rotator input line coupled to the rotator input for receiving the first code sequence or the second code sequence from the phase rotator, and an output line coupled to the serializer for transmitting a pacing signal to the serializer, wherein the pacing signal from the phase rotator increases the read frequency of the serializer in response to receiving the first code sequence at the first rotator input line, or decreases the read frequency of the serializer in response to receiving the second code sequence at the first rotator input line.

A second aspect of the present disclosure provides an apparatus including: a serial repeater having a deserializer coupled to a serial output line, and a serializer coupled to the deserializer through a data buffer; a phase detector having a first detector input line coupled to the deserializer to detect a write frequency of the deserializer and a second detector input line coupled to the serializer to detect a read frequency of the serializer, wherein the phase detector outputs a first code sequence at a rotator input in response to the write frequency being greater than the read frequency, and a second code sequence at the rotator input in response to the write frequency being less than the read frequency; and a phase rotator having a first rotator input line coupled to a phase locked loop (PLL) to receive a clock signal therefrom, a second rotator input line coupled to the rotator input for receiving the first code sequence or the second code sequence from the phase rotator, and an output line coupled to the serializer for transmitting a pacing signal to the serializer, wherein the phase rotator increases the read frequency of the serializer in response to receiving the first code sequence at the first rotator input line, or decreases the read frequency of the serializer in response to receiving the second code sequence at the first rotator input line.

A third aspect of the present disclosure provides a method including: transmitting a digital signal to a serial repeater, wherein the serial repeater includes a deserializer coupled to a serial output line of a photonic integrated circuit (PIC) die and a serializer coupled to the deserializer through a data buffer; determining whether a write frequency of the deserializer is different from a read frequency of the serializer; and transmitting a pacing signal to the serializer to modify the read frequency of the serializer, wherein the pacing signal increases the read frequency of the serializer in response to the write frequency being greater than the read frequency, or decreases the read frequency of the serializer in response to the write frequency being less than the read frequency.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the present disclosure provide an apparatus and related method to synchronize write and read frequencies, e.g., in a serial repeater. Embodiments of the disclosure can reduce mismatch between the read frequency and the write frequency of a serial repeater when data is transmitted to the serial repeater at a different speed from the clock where the serial repeater is located. An apparatus according to the disclosure may include a phase detector for detecting a write frequency of the deserializer and a read frequency of the serializer. The phase detector may output a first code sequence in response to the write frequency being greater than the read frequency, or a second code sequence at the rotator input in response to the write frequency being less than the read frequency. In various implementations, a control block of the phase rotator may transmit several types of first or second code sequences based on the frequency difference between the read and write frequencies, which may correspond to desired incremental changes to the read frequency. The rotator input transmits the first or second code sequence to a phase rotator. The phase rotator may translate the first or second code sequence into a pacing signal with a phase equal to an input frequency to the phase rotator (provided, e.g., by a phase locked loop (PLL)). To more quickly align the output phase from the phase rotator with the deserializer operation, the pacing signal code may change at a periodic rate indicated by the first or second code sequence. In an example embodiment, a rotator output frequency faster than the PLL may indicate that the code sequence entering the rotator will decrease at a periodic rate. A rotator output frequency slower than the PLL may indicate that the sequence entering the rotator will increase at a period rate. Faster code changes may occur in response to larger frequency differences between the input from the PLL and the pacing signal output from the phase rotator. The phase rotator, upon receiving the first or second code sequence, transmits a pacing signal to the serializer to increase or decrease the read frequency.

Figure 1:
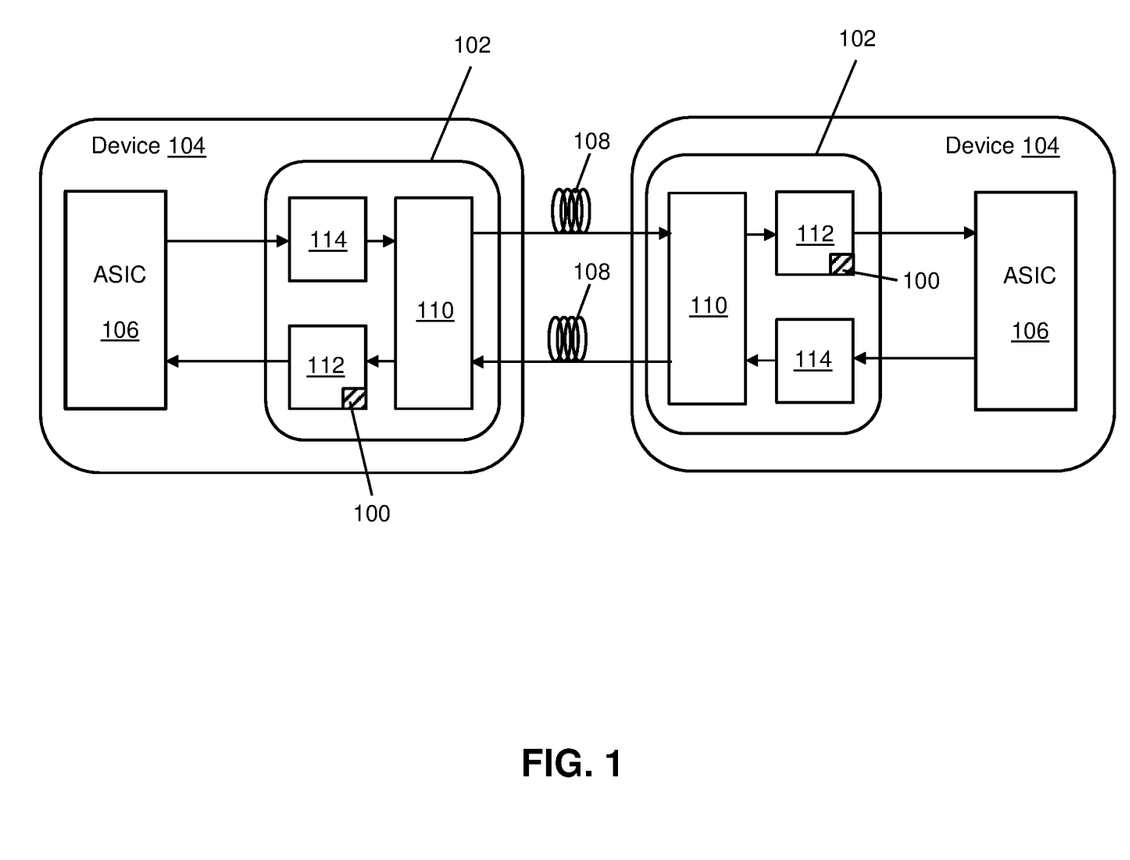
FIG. 1 shows a schematic view of an optical module for converting optical signals to digital signals, and coupled to an application specific integrated circuit (ASIC), according to embodiments of the disclosure.

Referring to FIG. 1, a schematic view of an apparatus 100 to synchronize read and write frequencies according to embodiments of the present disclosure is shown. Apparatus 100 may be provided at least partially within an optical transceiver 102 of a device 104. Optical transceiver 102 refers to a combination of components configured to convert digital signals to optical transceivers to be delivered to another device 104, and convert optical signals from other devices 104 back to digital signals for transmission elsewhere. Each device 104 may represent, e.g., an integrated circuit (IC) chip which includes multiple components or sub-components therein. As examples, device 104 may include optical transceiver 102 as one component and an application-specific integrated circuit (ASIC) 106 as another component electrically coupled to optical transceiver 102. An ASIC may refer to electronic circuitry configured to operate for specific purposes, e.g., digital voice recording, digital logic, system monitoring, etc.

Optical transceiver(s) 102 allow data to be exchanged between devices 104 in the form of light. As shown, devices 104 may be in communication with each other via optical fibers 108, with two fibers 108 being shown solely for the sake of example. ASICs 106 of each device 104 are electrically coupled to optical transceiver(s) 102, and thus may be capable of communicating with each other via optical fibers 108 through optical transceiver(s) 102. Each optical transceiver 102 can include sub-components for translating digital signals from ASIC 106 into optical signals for transmission to other optical transceiver(s) 102 via optical fiber(s) 108. Inside optical transceiver 102, the process of converting between electrical and optical signals takes place. A photonic integrated circuit (PIC) die 110 may be configured with circuitry to translate between optical signals and optical signals, filter various forms of noise and/or various types interference from incoming or outgoing signals, and relay the converted data to optical fiber 108, an internal receiver 112, and/or an internal transmitter 114 where applicable. Internal receiver 112 and internal transmitter 114 each may take the form of an independent IC sub-component of optical transceiver 102 for preparing outgoing data from ASIC 106 for transmission via PIC die 110 and optical fiber 108, or preparing incoming data from PIC die 110 and optical fiber 108 for use by ASIC 106.

At internal transmitter 114, various signals from signal ASIC 106 are received and equalized to eliminate inter-symbol interfere (ISI) from printed circuit board (PCB) traces between ASIC 106 and optical transceiver 102. After internal transmitter 114 completes the desired signal processing, the power level of the signal may be increased to drive operation of PIC die 110, and thereby transmit optical signals using optical fiber 108. In the reverse direction, incoming optical signals in other optical fibers 108 enter PIC die 110 to be converted from optical to digital signal formats. The converted signals are then transmitted to receiver assembly 112. Inside receiver assembly 112, various sub-components remove any existing optical and/or electrical ISI and buffer the signal where applicable before it is delivered to ASIC 106.

Figure 2:
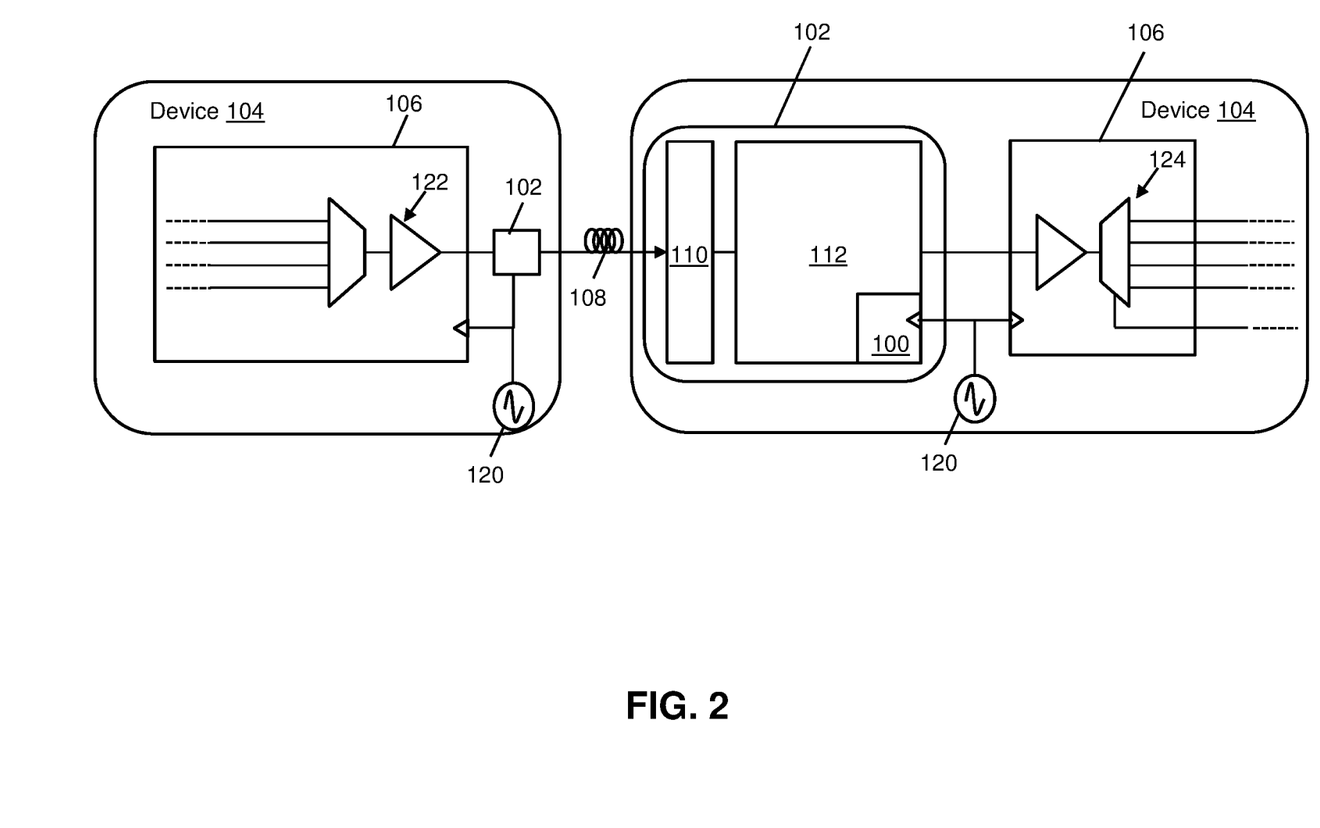
FIG. 2 shows a schematic view of an apparatus for processing optical signals according to embodiments of the disclosure.

FIG. 2 provides an expanded schematic view of optical transceiver 102, which may include apparatus 100, and device 104 according to embodiments of the disclosure. Transmitter assembly 114 (FIG. 1) is omitted from optical transceiver 102, as depicted in FIG. 2, solely for ease of illustration. In some cases, it is possible to provide apparatus 100 solely as a component for controlling or otherwise modifying the operation of receiver assembly 112. Thus, apparatus 100 may operate independently of transmitter assembly 114 in device 104 and/or other devices 104. As shown, each device 104 may include an electronic oscillator 120, i.e., a voltage source configured to output an alternating current (AC) voltage according to a predetermined profile. Each electronic oscillator 120 may be configured to generate the AC voltage with a predetermined amplitude, frequency, and phase difference. Electronic oscillator 120 of each device 104 may also drive the electrical operation of ASIC (s) 106 positioned thereon. For instance, ASIC 106 of the transmitting device 104 may include a deserializer 124 for converting a parallel signal into a serial signal for transmission via optical transceiver 102 and optical fiber 108. Device 104 on the receiving side may include ASIC 106, driven by electronic oscillator 120, with a deserializer 124 for re-converting the incoming serial data into parallel format. The combination of serializer 122 at a transmitting device 104 and deserializer 124 at a receiving device 104 may be known as a "SerDes," i.e., a transceiver architecture which provides data transmission over a single line (e.g., optical fiber 108) to reduce the need for hardware, input/output (I/O) pins and interconnects.

Apparatus 100 is operable to counteract possible inconsistencies between the operating frequencies of multiple devices. For example, each electronic oscillator 120 of each device 104 may be manufactured according to similar or even identical specifications, yet may have inconsistent performance due to manufacturing variations, actions undertaken by device(s) 104 or their users during operation, etc. For instance, electronic oscillator 120 of one device 104 may generate an AC voltage with a frequency of, e.g., 156.25 Megahertz (MHz), while the other device 104 may generate an AC voltage a slightly higher frequency of 156.25 MHz+ 100 parts per million (ppm), i.e., 156.265625 MHz. This slight difference in frequency causes synchronization challenges. For example, receiver assembly 112 is responsible for receiving converted inputs from PIC die 110 and providing a serial output to ASIC 106 after performing various operations. Since each device 104 and ASIC 106 operates independently of the other, each electronic oscillator 120 will also operate independently of the other. The operating frequency of receiver assembly 112 is dictated by electronic oscillator 120 of device 104 where it is located, but signals entering receiver assembly 112 will proceed at the speed of electronic oscillator 120 from the remotely operating device 104. During operation, apparatus 100 includes various features and subcomponents to detect whether electronic oscillator 120 for driving receiver assembly 112 is faster or slower than the frequency of other devices 104 driven by other electronic oscillators 120. Upon detecting a mismatch, apparatus 100 can interact with receiver assembly 112 to correct for operating at a higher or lower frequency than the electronic oscillator 120 where incoming signals originate.

Figure 3:
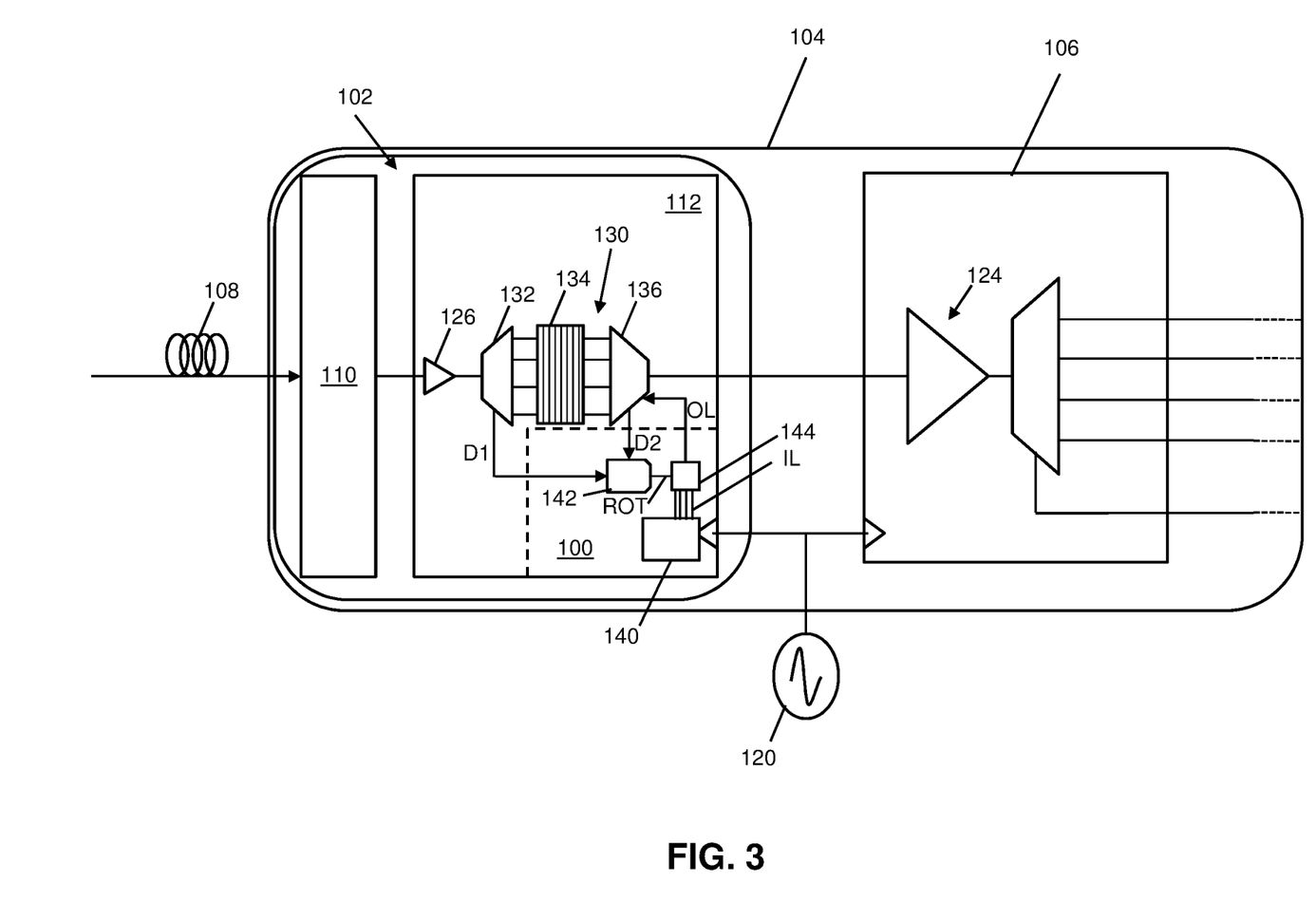
FIG. 3 shows an expanded schematic view of a receiver integrated circuit (IC) and ASIC in an apparatus according embodiments of the disclosure.

Referring to FIG. 3, various features of apparatus 100 are shown according to embodiments of the disclosure. Transmitter assembly 114 is omitted from FIG. 3 solely for ease of illustration. Apparatus 100 may be provided as part of receiver assembly 112 as shown, or alternatively may be structured as an independent component, device, etc., capable of interacting with receiver assembly 112. Receiver assembly 112 may receive digital signals from PIC die 110. In this case, the received digital signals were originally transmitted to device 104 via optical fiber 108 and converted to digital signals at PIC die 110 as described herein. As a result of receiving and processing signals that originate outside device 104, PIC die 110 will operate at the oscillation frequency of the device(s) which generated the incoming optical signals. In some cases, receiver assembly 112 may implement additional equalization and processing of the incoming digital signals. In example, receiver assembly 112 may include an equalization circuit 126 for equalizing the incoming digital signals by any currently-known or later developed technique, e.g., continuous time linear equalization (CTLE).

The incoming signals may proceed to a serial repeater 130. Serial repeater 130 may perform the function of further equalizing the incoming signals and reducing interference, as well as recovering digital words in the event that portions of data are lost during transit. Serial repeater 130 may include a deserializer 132 which further-equalizes the incoming digital signals by separating them into equivalent groups (i.e., words) of parallel data, and additionally may remove inter-symbol interference (ISI) from the signal. The parallel data may travel to a data buffer 134, e.g., a first-in-first-out (FIFO) buffer where the incoming data is temporarily written for retrieval by other elements of serial repeater 130. The frequency at which deserializer 132 writes incoming data to data buffer 134 may be designated as a "write frequency" of serial repeater 130. A serializer 136 of serial repeater 130 may retrieve data from data buffer 134, where it may be reconverted into serial data for transmission to ASIC 106. The frequency at which serializer 136 reads data from data buffer 134 may be designated as a "read frequency" of serial repeater 130. Serializer 136 may be electrically coupled to electronic oscillator 120 through a phase locked loop (PLL) 140. PLL 140 may be embodied as any currently known or later developed electronic circuit structured to generate a signal with the same phase as an incoming signal, but with a modified frequency.

In the example of FIG. 3, serial repeater 130 may temporarily separate incoming serial data into sixty-four parallel data lines through data buffer 134. In this example, the resulting data frequency in each parallel line would be one sixty-fourth of the serial data frequency. Thus, PLL 140 can be a "divide down" circuit which outputs a clock signal for serializer 136 that is one-sixty fourth the signal frequency of electronic oscillator 120. The parallel data is thus written into data buffer 134 at a write frequency derived from the signal frequency entering device 104, and is read from data buffer 134 at a read frequency governed by electronic oscillator 120. Embodiments of apparatus 100, and related methods, are operable to reduce or minimize the amount of mismatch between the read frequency and the write frequency of serial repeater 130.

To reduce mismatch between the write and read frequencies of serial repeater 130, apparatus 100 can compare the two frequencies and modify the frequency of serializer 136 to compensate for differences between the frequencies. Apparatus 100 may include a phase detector 142. Phase detector 142 may take the form of a frequency mixer, analog multiplier, and/or any other logic circuit that generates a code indicative of the difference in phase between two signal inputs. In this context, the term "code" may refer to a multi-bit digital signal representative of a type of differential (e.g., early or late operation) with additional binary digits indicating the amount of difference between read and write frequencies. In a simplified example, the term "code" may refer to a single binary digit indicating early or late operation. Phase detector 142 may include a first detector line D1 for detecting the read frequency of deserializer 132, and a second detector line D2 for detecting the write frequency of serializer 136. The circuitry of phase detector 142 may be configured to output a first code sequence (e.g., a sequence of codes having several distinct binary digits) at a rotator input ROT upon detecting the write frequency being greater than the read frequency. Similarly, phase detector 142 may be configured to output a second code sequence (e.g., a different binary code) at rotator input ROT upon detecting the write frequency being less than the read frequency. In either case, the voltage output from phase detector 142 travels to other components which interpret the code and implement further steps to correct for any differences between the frequencies.

A phase rotator 144 of apparatus 100 may be coupled to rotator input ROT, and thus may receive the first or second code sequence from phase detector 142. Phase rotator 144 may take the form of any conceivable circuit configured to implement a phase shift on incoming signals, e.g., such that the output signal profile is distinct from an incoming signal profile. The phase shift imposed by phase rotator 144 may be positive or negative based on internal logic, which may select a type or degree of modification based on incoming signals (e.g., the first or second code sequence received via rotator input ROT). Phase rotator 144 may also be coupled to PLL 140 through a plurality of rotator input lines (IL), each based on the divided-down clock from PLL 140. Each input line IL may represent corresponding phase offsets from PLL 140, e.g., zero degrees, ninety degrees, one-hundred eighty degrees, and two-hundred seventy degrees. In any case, the first or second code sequence transmitted to phase rotator 144 via rotator input ROT may take the form of a digital control code with instructions to select one of the four rotator input lines (IL) for transmission as a pacing signal. Phase rotator 144 may include an output line OL for transmitting a pacing signal to serializer 136. The transmitted pacing signal may contain digital instructions for modifying the frequency of serializer 136, e.g., to compensate for differences between the current read frequency and the current write frequency of serial repeater 130.

Phase detector 142 and phase rotator 144 of apparatus 100 may work in tandem to modify the read frequency of serializer 136. Serializer 136 may include circuitry to modify its speed of operation based on pacing signals output by phase rotator 144. In the case where phase detector 142 outputs the first code sequence upon detecting the write frequency as being greater than the read frequency, phase rotator 144 will output a pacing signal which causes serializer 136 to increase the read frequency. In the case where phase detector 142 outputs the first code sequence upon detecting the write frequency as being less than the read frequency, phase rotator 144 will output a pacing signal which causes the read frequency of serializer 136 to decrease. Phase detector 142 and phase rotator 144 may operate continuously to account for changes in the operation and profile of device(s) 104. Thus, apparatus 100 will further modify the operating speed of serializer 136 despite having no control over electronic oscillators 120 of other devices 104, and without affecting the operation of ASIC(s) 106. In one example, phase detector 142 and phase rotator 144 may thus respond immediately to a single mismatch between the write frequency and read frequency of serial repeater 130. In further examples, phase detector 142 and phase rotator 144 may sample the write frequency and read frequency of serial repeater 130 over a predetermined time, and output pacing signals to serializer 136 only after monitoring the collected samples. In embodiments where multiple frequencies are sampled, phase rotator 144 may include a proportional-integral clock with logic for further adjusting the modified read frequency of the pacing signal based on several previous signal voltages received via rotator input ROT.

Figure 4:
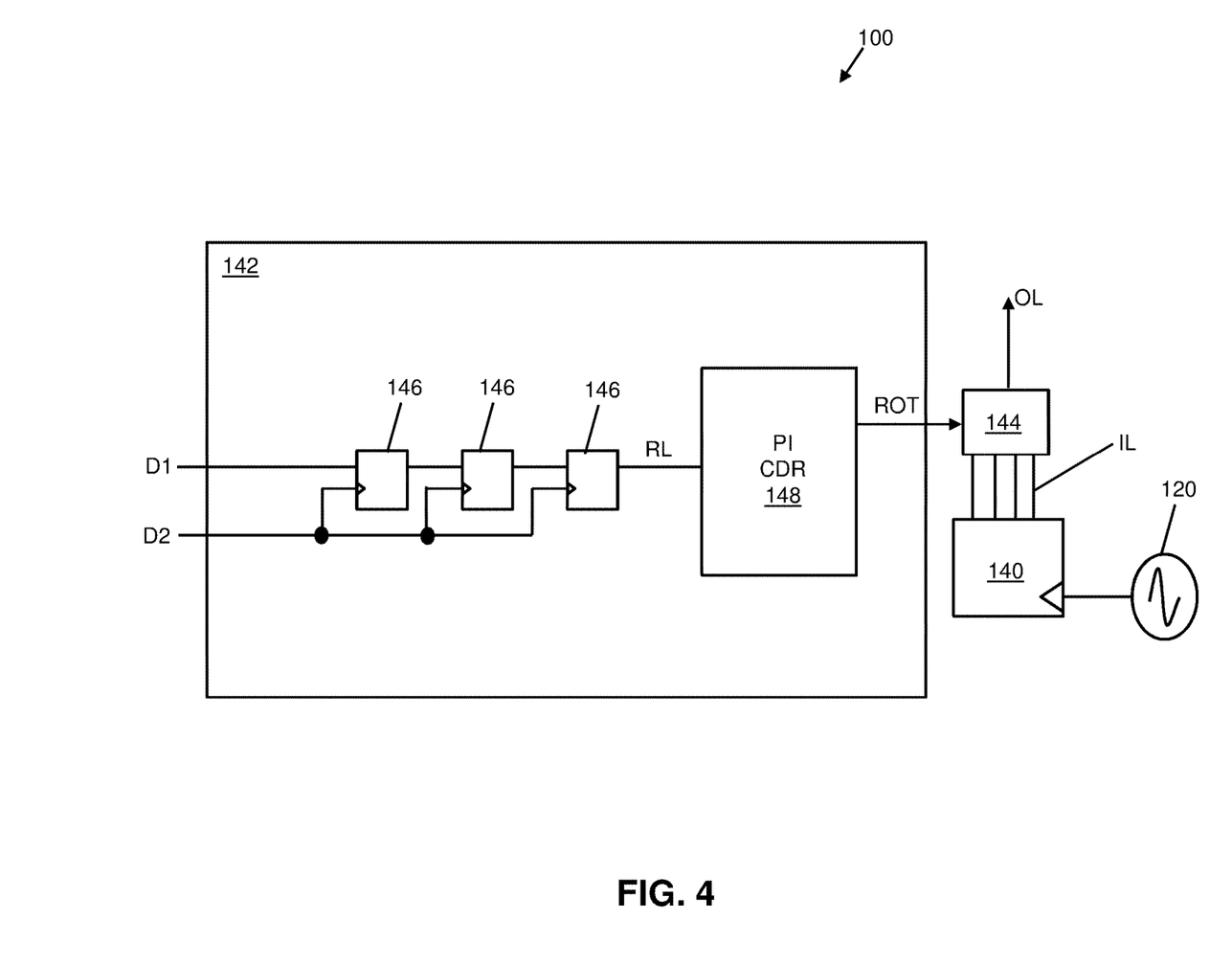
FIG. 4 shows a further expanded schematic view of a phase detector, phase rotator, and phase locked loop (PLL) according to embodiments of the disclosure.

Referring to FIG. 4, an expanded view of apparatus 100 is shown to further illustrate sub-components of phase detector 142 in various embodiments. Phase detector 142 may take the form of a bang-bang controller with several flip-flops 146 to prevent non-determinant outputs (i.e., a voltage that cannot be distinguished between the first or second code sequence) from phase rotator 144. A bang-bang controller refers to any device for implementing a binary control function for switching between two states. In the case of apparatus 100, the two states may correspond to the write frequency being too fast for the read frequency, or the write frequency being too slow for the read frequency. A bang-bang controller may be implemented via any component which distinguishes between binary possibilities, e.g., flip-flops 146. Flip-flops 146 may represent any circuit that has two stable states and can be used to store state information, including latches and/or other types of digital memory. Each flip-flop 146 can be made to change state by signals applied to one or more control inputs and thus may produce corresponding outputs. In the case of apparatus 100, each flip-flop 146 may include one input coupled to second detector input D2, e.g., for receiving the read frequency of serializer 136 (FIG. 3). One flip-flop 146 may be coupled to first detector input D1, while the remaining flip-flops 146 may be coupled to the output of another flip-flop 146. One flip-flop 146 may be coupled at its output to a reference line RL. In this configuration, phase detector 142 will capture samples of the write frequency on the rising edge of the corresponding write frequency via flop flops 146. By using multiple flip-flops 146 together, phase detector 142 creates a metastability pipeline which prevents indeterminant outputs, e.g., by requiring multiple successive comparisons with the read frequency at second detector input D2.

During operation, the code transmitted via rotator input ROT will represent the output of flip-flop(s) 146, and will function as a simple "early" or "late" indication for phase rotator 144. According to an example, a first code sequence received in rotator input ROT indicates that the read frequency voltages were sampled too early. In this case, phase rotator 144 may output a pacing signal for decreasing the read frequency, i.e., to drive the read frequency closer to the write frequency sample. A second code sequence transmitted via rotator input ROT may indicate the opposite case. Here, the read frequency voltages were sampled too late and the read frequency may be increased to bring the read frequency of serializer 136 (FIG. 3) closer to the write frequency of deserializer 132 (FIG. 3). The amount by which phase rotator 144 signals serializer 136 to adjust the read frequency may be dependent on additional information encoded within the first or second code sequence, and may include a predetermined phase offset (e.g., selection of a zero, ninety, one-hundred eighty, or two-hundred seventy degree offset from PLL 140). In any case, phase detector 142 may include a proportional-integral clock and data recovery unit (PI CDR) 148 which is configured to compute an average or other representative indication of previous outputs from phase detector 142. In some embodiments, PI CDR 148 may calculate a representative indication of several outputs from flip flop(s) 146, which may be used to digitally control the operation of phase rotator 144. PI CDR 148 may provide two functions: proportional calculation for tracking the phase of the read and write frequencies, and integration for calculating the average difference between the write and read frequencies. In this case, phase rotator 144 may select one of the rotator input lines IL, based on the calculation, such that the pacing signal instructs serializer 134 to add or subtract a predetermined phase differential to the read frequency.

Figure 5:
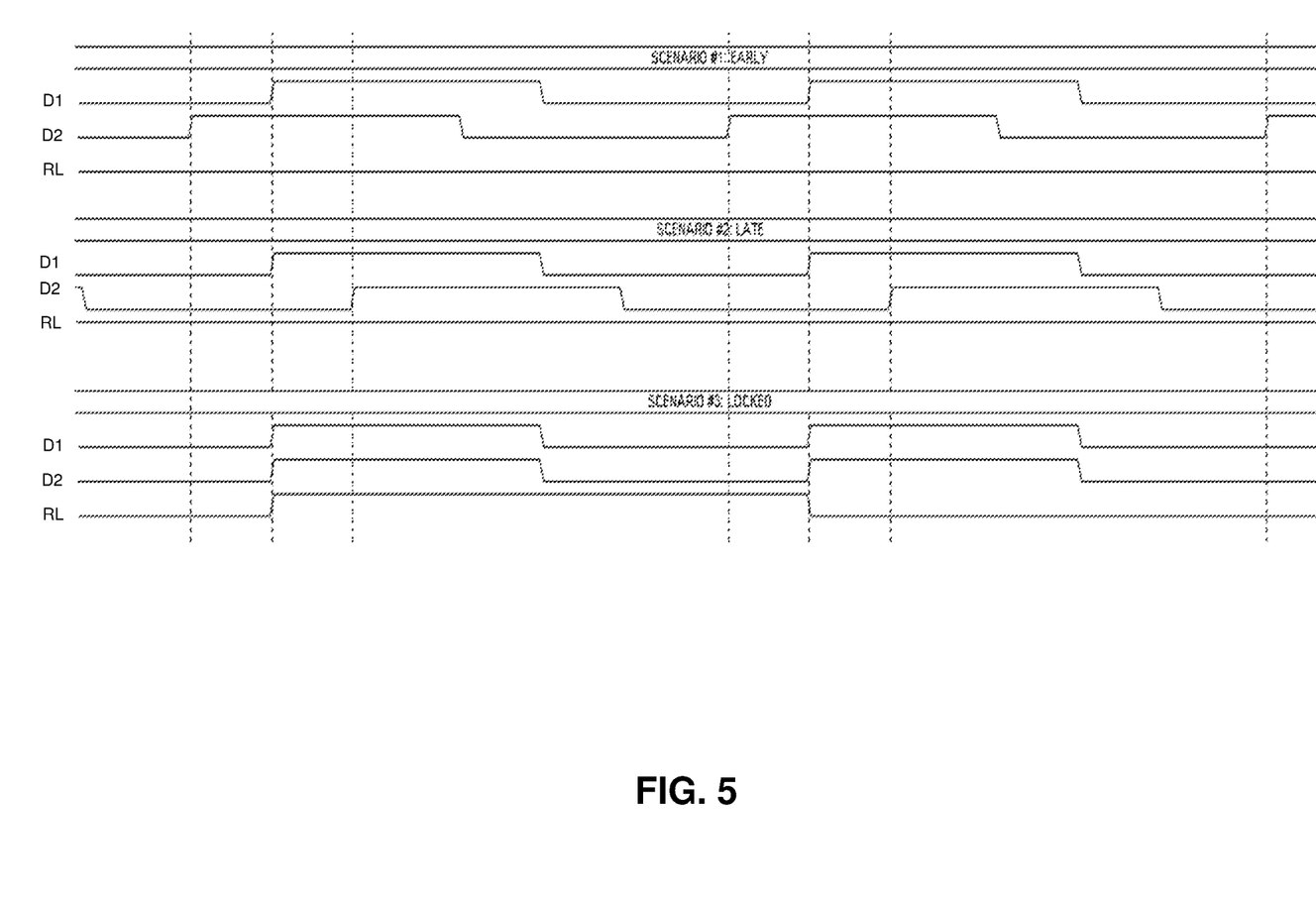
FIG. 5 shows a set of plots for comparing example early, late, and locked pairs of read and write frequencies according to the disclosure.

Referring to FIGS. 4 and 5, three comparative plots are shown to illustrate the operation of apparatus 100 in three different scenarios: the read frequency (indicated in second detector input line D2) being ahead of the write frequency (indicated in first detector line D1), a second example of the read frequency being behind the write frequency, and an example of the write and frequencies being "locked," i.e., having a synchronized frequency and phase differential. In "Scenario #1: Early," the rising edge transition of the read signal is captured in second detector input line D2 before the corresponding rising edge transition of the read signal. In this situation, phase detector 142 may cause rotator input ROT will transmit a first logic level (i.e., high or low) to illustrate that the read operation is occurring too early. In an example embodiment of apparatus 100, the output from rotator input ROT may cause phase rotator 144 to generate a pacing signal in output line OL which causes a frequency decrease. The frequency decrease may be predetermined (e.g., a step change of fifty ppm), or may be based on the amount of latency in cases where phase rotator 142 includes PI CDR 148. Over time, the frequency reduction(s) by phase rotator 142 will cause the read frequency and the write frequency to be substantially synchronous, i.e., have substantially the same frequency and phase.

"Scenario #2: Late," depicts an opposite example from "Scenario #1: Early." In this case, the rising edge of the read frequency is detected in second detector input line D2 after the rising edge of the write frequency is detected in first detector input line D1. In this case, phase detector 142 may cause rotator input ROT to transmit an opposite logic level to illustrate that the read operation is occurring too early. As a result, phase rotator 144 may generate a pacing signal in output line OL which causes a frequency increase. Similar to other examples, the amount of frequency increase may be a predetermined step function, or may be dependent on the amount of difference between the signals (e.g., where phase rotator 142 includes PI CDR 148).

In the third example, "Scenario #3 (Locked)," the rising edge of the write and read frequencies are detected at substantially the same time in first and second detector input lines D1, D2. In this case, phase detector 142 may produce an output that toggles back and forth between logic high and logic low. In cases where phase detector 142 includes flip-flops 146, some skew between the detected edges may be present as a result latch setup time and/or other intrinsic delays. In any case, phase rotator 144 may be configured to refrain from generating pacing signals at output line OL in the event that alternating first and second code sequences are transmitted to phase rotator 144 over a predetermined time period or number of samples. In a more simplified example, phase rotator 144 may still output a pacing signal indicative of a frequency increase or decrease even when the read frequency and write frequency are synchronous. However, in this non-limiting example, the next sample will indicate an early or late read signal in the next sample and cause phase rotator 144 to output a pacing signal for a counteracting frequency increase or decrease. Although this may cause the write frequency to be increased or decreased periodically during periods of synchronous operation, the amount of increase or decrease may be selected to be an extremely small step change (e.g., no more than approximately 1.5% difference from the previous frequency). Under such circumstances, repeated increases and decreases of the read frequency would be inconsequential and thus substantially maintain synchronous operation.

Returning to FIGS. 3 and 4, embodiments of the disclosure also provide methods to synchronize a read frequency and a write frequency of a device, e.g., serial repeater 130 as discussed herein regarding apparatus 100. In a non-limiting example, methods according to the disclosure may include transmitting a digital signal to serial repeater 130. The incoming digital signal may have been previously converted from an incoming optical signal, e.g., by PIC die 110. Serial repeater 130 may include deserializer 132 coupled to serializer 136 through data buffer 134. Methods according to the disclosure may include determining, e.g., via phase detector 142, whether the write frequency of deserializer 132 is greater than the read frequency of serializer 136. First and second detector input lines D1, D2 may be coupled to phase detector 142 to detect the read frequency and the write frequency. The method may include transmitting, e.g., via output line OL of phase rotator 144 coupled to phase detector 142, a pacing signal to serializer 136. The pacing signal may increase the read frequency of serializer 136 in cases where the write frequency is greater than the read frequency, or may decrease the read frequency of serializer 136 in cases where the write frequency is less than the read frequency.

As discussed elsewhere herein, methods according to the disclosure may include features for further control of internal receiver 112 and/or serial repeater 130. For example, methods according to the disclosure may include outputting the pacing signal to modify a phase offset of serializer 136, in addition to the read frequency. Additionally, the pacing signal may be modified from the operating frequency of PLL 140 (e.g., a divided-down frequency), which itself may be generated using electronic oscillator 120. As noted elsewhere herein, the frequency of digital signals entering deserializer 132 may be independent of electronic oscillator 120. In further non-limiting examples, the determining of whether the write frequency is different from the read frequency may be implemented using phase detector 142 in the form of a bang-bang controller which uses flip-flops 146 and/or PI CDR 148 to determine whether the read frequency is different from the write frequency. Additionally, phase rotator 144 may calculate values for the write and read frequencies based on several outputs from phase detector 142.

Embodiments of the present disclosure provide various technical and commercial advantages, some of which are discussed by example herein. As compared to conventional device structures, embodiments of apparatus 100 rely on only a single signal processing circuit via electronic oscillator 120 to synchronize the reading and writing of converted optical data within optical transceiver 102. In some cases (e.g., the example embodiment shown in FIG. 1) two optical transceivers 102 each may include an embodiment of apparatus 100 therein to maintain synchronicity of a data exchange between two or more devices 104. Additionally, the example implementation of phase detector 142 in combination with phase rotator 144 within internal receiver 112 may cause apparatus 100 to be effective even when apparatus 100 is not included in an interconnected device 104.

As used herein, the term "configured," "configured to" and/or "configured for" can refer to specific-purpose patterns of the component so described. For example, a system or device configured to perform a function can include a computer system or computing device programmed or otherwise modified to perform that specific function. In other cases, program code stored on a computer-readable medium (e.g., storage medium), can be configured to cause at least one computing device to perform functions when that program code is executed on that computing device. In these cases, the arrangement of the program code triggers specific functions in the computing device upon execution. In other examples, a device configured to interact with and/or act upon other components can be specifically shaped and/or designed to effectively interact with and/or act upon those components. In some such circumstances, the device is configured to interact with another component because at least a portion of its shape complements at least a portion of the shape of that other component. In some circumstances, at least a portion of the device is sized to interact with at least a portion of that other component. The physical relationship (e.g., complementary, size-coincident, etc.) between the device and the other component can aid in performing a function, for example, displacement of one or more of the device or other component, engagement of one or more of the device or other component, etc.

The descriptions of the various embodiments of the present disclosure have been presented for purposes of illustration, but are not intended to be exhaustive or limited to the embodiments disclosed. Many modifications and variations will be apparent to those of ordinary skill in the a without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
a phase detector having a first detector input line coupled to a deserializer of a serial repeater to detect a write frequency of the deserializer and a second detector input line coupled to a serializer of the serial repeater to detect a read frequency of the serializer, wherein the phase detector is configured to (i) output a first code sequence at a rotator input in response to the write frequency being greater than the read frequency and (ii) output a second code sequence at the rotator input in response to the write frequency being less than the read frequency; and
a phase rotator having a first rotator input line coupled to a phase locked loop (PLL) to receive a clock signal therefrom, a second rotator input line coupled to the rotator input for receiving either one of the first code sequence and the second code sequence from the phase rotator, and an output line coupled to the serializer for transmitting a pacing signal to the serializer,
wherein the pacing signal from the phase rotator is configured to increase the read frequency of the serializer in response to receiving the first code sequence at the first rotator input line and decrease the read frequency of the serializer in response to receiving the second code sequence at the first rotator input line.

2. The apparatus of claim 1, wherein the clock signal of the PLL is based on an electronic oscillator frequency, and wherein the write frequency is independent of the electronic oscillator frequency.

3. The apparatus of claim 1, wherein the phase detector includes a bang-bang controller having a plurality of flip-flops configured to prevent non-determinant outputs at the rotator input.

4. The apparatus of claim 3, wherein the bang-bang controller of the phase detector further includes a proportional-integral clock (PI CDR) coupled to the plurality of flip flops, wherein the PI CDR generates the first or second code sequence based on a sample from the plurality of flip flops.

5. The apparatus of claim 1, wherein the serializer is coupled to the deserializer through a first-in-first-out (FIFO) data buffer.

6. The apparatus of claim 1, wherein the phase detector detects the write frequency of the deserializer and the read frequency of the serializer based on a plurality of signal samples within the serial repeater.

7. The apparatus of claim 1, wherein the phase detector and the phase rotator comprise portions of an integrated circuit (IC) within a receiver assembly.

8. An apparatus comprising:
a serial repeater having a deserializer coupled to a serial output line, and a serializer coupled to the deserializer through a data buffer;
a phase detector having a first detector input line coupled to the deserializer to detect a write frequency of the deserializer and a second detector input line coupled to the serializer to detect a read frequency of the serializer, wherein the phase detector is configured to (i) output a first code sequence at a rotator input in response to the write frequency being greater than the read frequency, and (ii) output a second code sequence at the rotator input in response to the write frequency being less than the read frequency; and
a phase rotator having a first rotator input line coupled to a phase locked loop (PLL) to receive a clock signal therefrom, a second rotator input line coupled to the rotator input for receiving either one of the first code sequence and the second code sequence from the phase rotator, and an output line coupled to the serializer for transmitting a pacing signal to the serializer,
wherein the phase rotator is configured to increase the read frequency of the serializer in response to receiving the first code sequence at the first rotator input line and decrease the read frequency of the serializer in response to receiving the second code sequence at the first rotator input line.

9. The apparatus of claim 8, wherein the phase detector detects the write frequency of the deserializer and the read frequency of the serializer based on a plurality of signal samples from the serial repeater.

10. The apparatus of claim 8, wherein the phase detector includes a bang-bang controller having a plurality of flip-flops configured to prevent non-determinant outputs at the rotator input.

11. The apparatus of claim 10, wherein the bang-bang controller of the phase detector further includes a proportional-integral clock (PI CDR) coupled to the plurality of flip flops, wherein the PI CDR generates the first or second code sequence based on a sample from the plurality of flip flops.

12. The apparatus of claim 8, wherein the data buffer comprises a first-in-first-out (FIFO) data buffer.

13. The apparatus of claim 8, further comprising an electronic oscillator coupled to the PLL and configured to create the clock signal, wherein the write frequency is independent of a frequency of the electronic oscillator.

14. The apparatus of claim 13, further comprising an application specific integrated circuit (ASIC) switch chip coupled to an output of the deserializer, wherein the electronic oscillator creates a clock signal of the ASIC switch chip.

15. A method comprising:
transmitting a digital signal to a serial repeater, wherein the serial repeater includes a deserializer coupled to a serial output line of a photonic integrated circuit (PIC) die and a serializer coupled to the deserializer through a data buffer;
determining whether a write frequency of the deserializer is different from a read frequency of the serializer; and
transmitting a pacing signal to the serializer to modify the read frequency of the serializer, wherein the pacing signal increases the read frequency of the serializer in response to the write frequency being greater than the read frequency and decreases the read frequency of the serializer in response to the write frequency being less than the read frequency.

16. The method of claim 15, wherein the transmitted pacing signal modifies a frequency and a phase of the read frequency based on a frequency differential between the write frequency and the read frequency.

17. The method of claim 15, wherein transmitting the pacing signal to the deserializer includes transmitting a clock signal from a phase locked loop (PLL) to a phase rotator to create the pacing signal.

18. The method of claim 17, further comprising using an electronic oscillator to create the clock signal of the PLL, and wherein the write frequency is independent of a frequency of the electronic oscillator.

19. The method of claim 15, wherein determining whether the write frequency of the deserializer is different from the read frequency of the serializer includes coupling the deserializer and the serializer to a bang-bang controller configured to output a first code sequence in response to the write frequency being greater than the read frequency, or a second code sequence in response to the write frequency being less than the read frequency.

20. The method of claim 15, further comprising calculating the write frequency of the deserializer and the read frequency of the serializer based on a plurality of signal samples from the serial repeater.

* * * * *